United States Patent [19]
Muller et al.

[11] Patent Number: 5,493,177
[45] Date of Patent: Feb. 20, 1996

[54] SEALED MICROMACHINED VACUUM AND GAS FILLED DEVICES

[75] Inventors: Richard S. Muller, Kensington, Calif.; Carlos H. Mastrangelo, Ann Arbor, Mich.; Kirt R. Williams, Orinda, Calif.

[73] Assignee: The Regents of the University of California, Oakland, Calif.

[21] Appl. No.: 143,220

[22] Filed: Oct. 26, 1993

Related U.S. Application Data

[63] Continuation-in-part of Ser. No. 621,678, Dec. 3, 1990, Pat. No. 5,285,131.

[51] Int. Cl.[6] .................................................... H01K 1/50
[52] U.S. Cl. ............................................................ 313/578
[58] Field of Search ................................... 313/582, 587, 313/588, 309, 522, 578; 445/24, 50, 51

[56] References Cited

U.S. PATENT DOCUMENTS

| | | | |
|---|---|---|---|
| 1,925,857 | 9/1933 | Van Liempt | 176/16 |
| 4,455,561 | 6/1984 | Boyden et al. | 346/140 R |
| 4,724,356 | 2/1988 | Daehler | 313/522 |
| 4,749,443 | 6/1988 | Mitchell et al. | 156/653 |
| 5,090,254 | 2/1992 | Guckel et al. | 73/862.59 |

OTHER PUBLICATIONS

"Performance and Design Considerations of the Thin–Film Tungsten Matrix Display," Paul M. Alt and Peter Pleshko, *IEEE Transactions on Electron Devices*, vol. Ed–20, No. 11, Nov. 1973.
"A Thin–Film Integrated Incandescent Display," Frederick Hochberg, Hugo K. Seitz and Alan V. Brown, *IEEE Transactions on Electron Devices*, vol. ED–20, No. 11, Nov. 1973.
"Integrated Transducers Based on Blackbody Radiation from Heated Polysilicon Filaments," H. Guckel and D. W. Burns, Wisconsin Center for Applied Microelectronics, University of Wisconsin, Madison, Wisconsin.
"Integrated–Circuit Broadband Infrared Sources," G. Lamb, M. Jhabvala and A. Burgess of Goodard Space Flight Center, *NASA Tech Briefs*, Mar. 1989.
"Lightly Doped Polysilicon Bridge as an Anemometer," Yu–Chong Tai and Richard S. Muller, Berkeley Integrated Sensor Center, *Tranducers '87*.
"Micro–Diaphragm Pressure Sensor," S. Sugiyama, T. Suzuki et al., Toyota Central Research & Development Lab., Inc., *Rec. of the IEEE Int. Electron Devices Meeting*, 1986, pp. 184–187.
S. Zurn et al., "Sealed Vacuum Electronic Devices by Surface Micromachining," Technical Digest, IEEE Int. Electr. Devices Meeting, 205–208, Dec. 1991, Washington DC.
K. Williams et al., "IC–Processed Hot–Filament Vacuum Microdevices," Technical Digest, IEEE Int. Electr. Devices Meeting, 387–390, San Francisco, CA, Dec. 13–16 1992.
Liwei Lin et al., "Vacuum–Encapsulated Lateral Microresonators," Technical Digest, 7th Int. Conf. on Solid–State Sensors and Acuators (270–273), Inst. of Electr. Eng. of Japan, 7–10 Jun. 1993, Yokohama, Japan.
C. H. Mastrangelo et al., "Microfabricated incandescent lamps," *Applied Optics*, vol. 30, No. 7, 1 Mar. 1991.
K. Ikeda et al., "Silicon Pressure Sensor with Resonant Strain Gages Built into Diaphragm," *Technical Digest of the 7th Sensor Symposium*, 1988, pp. 55–58.

(List continued on next page.)

*Primary Examiner*—Edward L. Coles, Sr.
*Assistant Examiner*—Jerome Grant, II
*Attorney, Agent, or Firm*—Fish & Richardson

[57] ABSTRACT

A surface and/or bulk micromachined hermetically sealed cavity containing at least one suspended structure in a low pressure ambient, and the associated fabrication method. The cavity is bounded by a thin-film membrane and a substrate which may have a recess. The method can be used for the production, for example, of thermionic-emission vacuum tubes, gas filled tubes and electromechanical devices. In vacuum tubes the cathode is a suspended refractory filament. Other electrodes may also be suspended. In electromechanical devices the suspended members may be cantilever beams capable of low friction motion.

6 Claims, 15 Drawing Sheets

OTHER PUBLICATIONS

H. Guckel et al., "Construction and Performance Characteristics of Polysilicon Resonating Beam Force Transducers," *Integrated Micro–Motion Systems,* F. Harashima ed., Elsevier Science Publishers, Amsterdam, 1990.

C. H. Mastrangelo and R. S. Muller, "Vacuum–sealed micromachined incandescent light source," *IEDM Tech. Dig.,* Dec. 1989, pp. 503–506.

D. K. Lynn et al., "Thermionic integrated electronics: electronics for hostile environments," *IEEE Trans. Nuclear Science,* vol. 32, No. 6, Dec. 1985, pp. 3996–4000.

J. Byron McCormick et al., "Development of integrated thermionic circuits for high–temperature applications," *IEEE Trans. Industrial Electronics,* vol. 29, No. 2, May 1992, pp. 140–144.

H. H. Busta, "Vacuum microelectronics–1992," *J. Micromech. Microeng.,* vol. 2, pp. 43–74.

R. Greene et al. "Vacuum integrated circuits," *IEDM Tech. Dig.,* Dec. 1985, pp. 172–175.

T. Utsumi, "Vacuum electronics: what's new and exciting," *IEEE Trans. Electron Devices,* vol. 38, No. 10, Oct. 1991, pp. 2276–2283.

H. Guckel et al. "Polysilicon resonant microbeam technology for high performance sensor applications," University of Wisconsin Center for Applied Microelectronics, Madison, WI 53706.

K. Ikeda et al. "Thee–dimensional Micromachining of Silicon Pressure Sensor Integrating Resonant Strain Gauge on Diaphragm," *Sensors and Actuators,* A21–A23 (1990) 1007–1010.

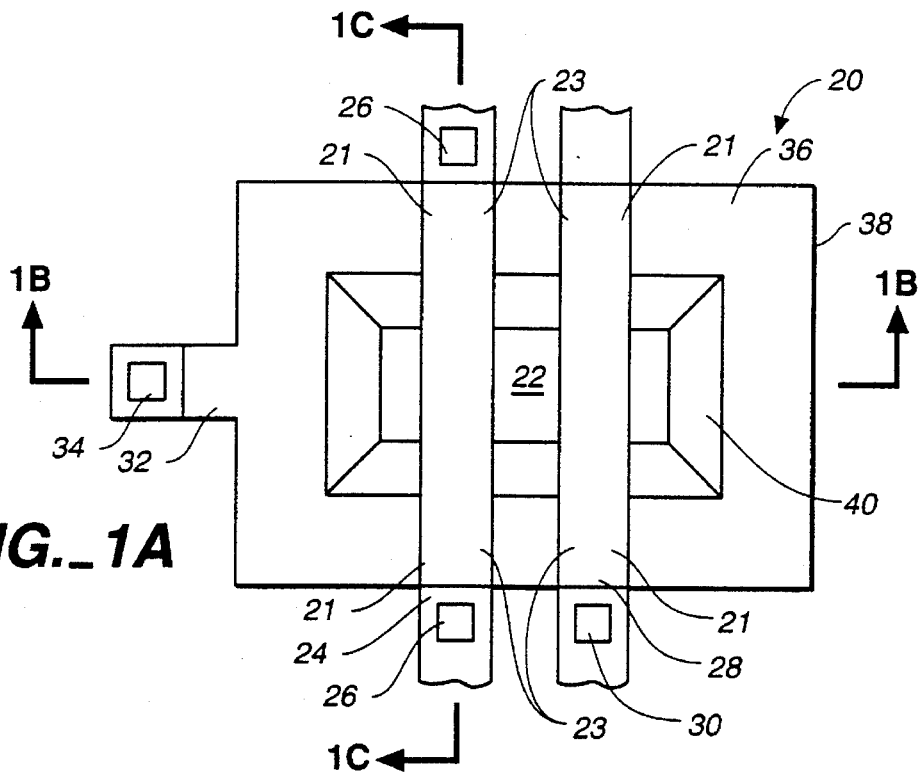
FIG._1A
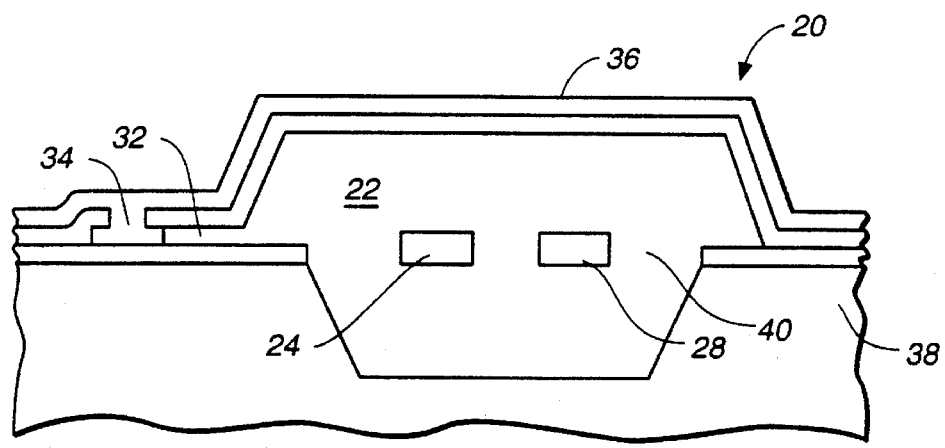
FIG._1B
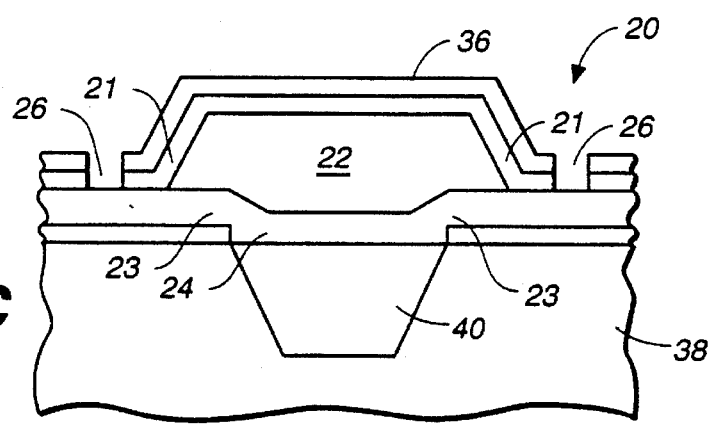
FIG._1C

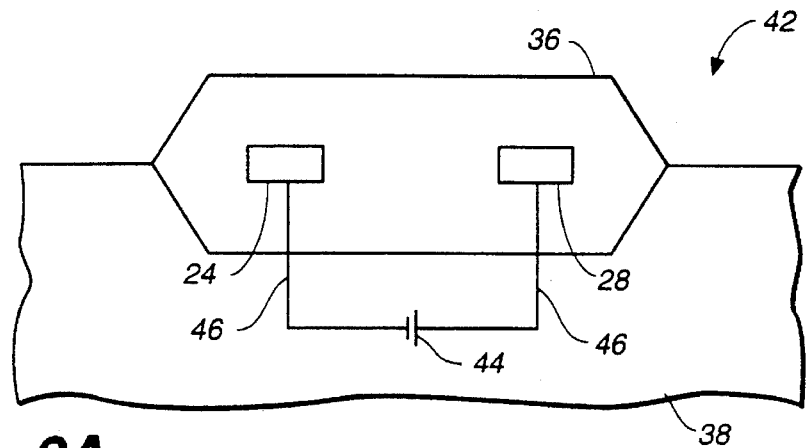
FIG._2A
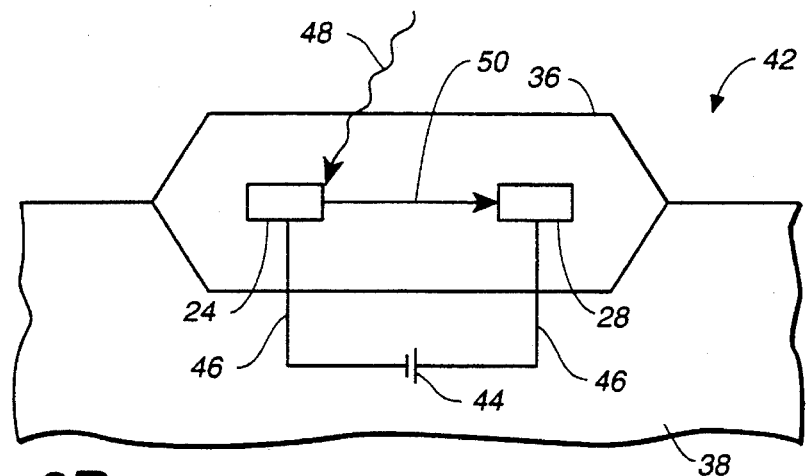
FIG._2B
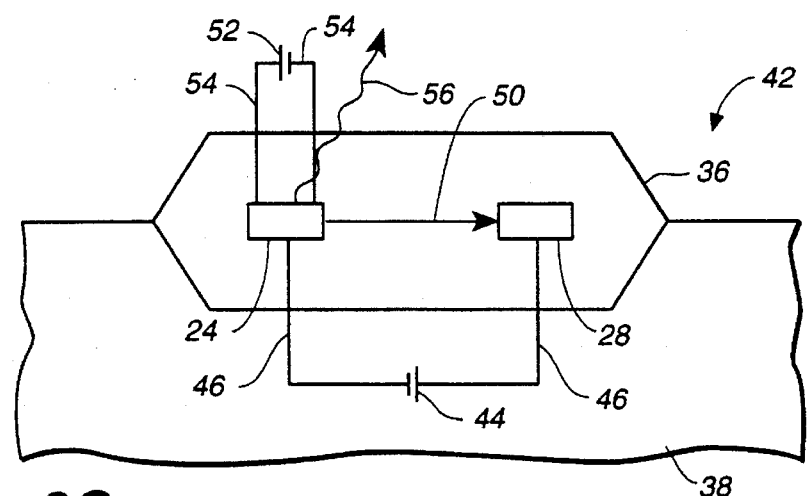
FIG._2C

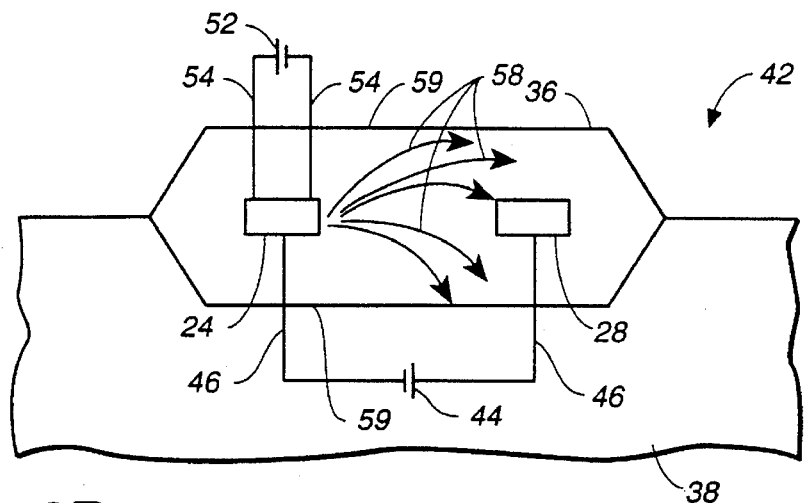
FIG._2D
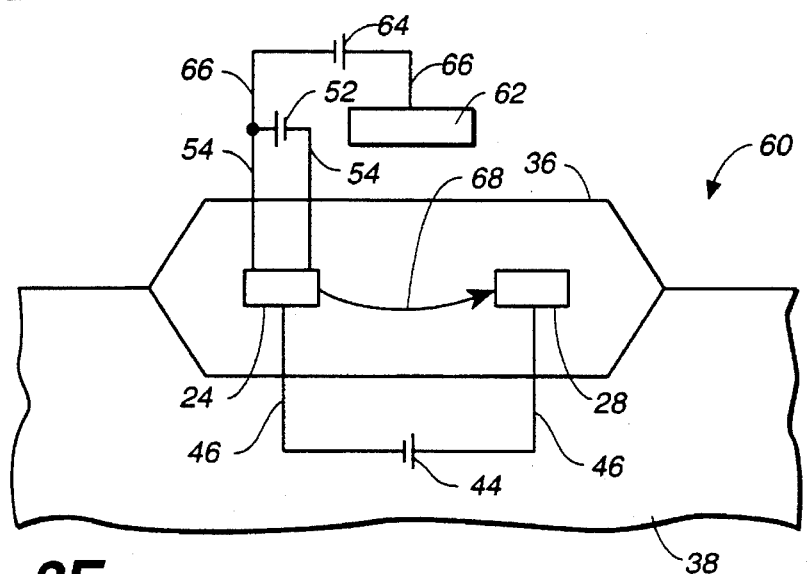
FIG._2E
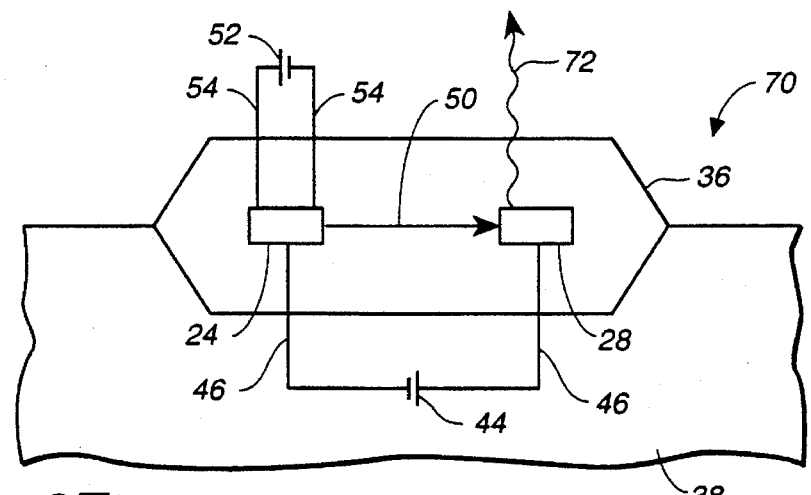
FIG._2F

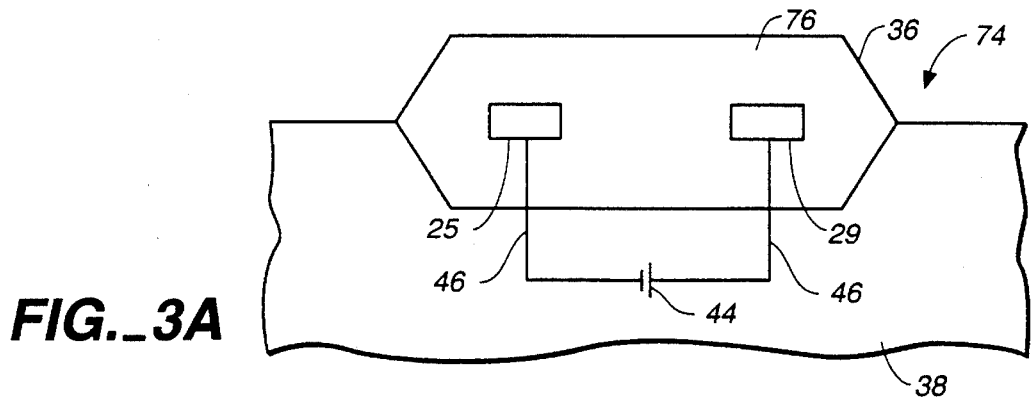
FIG._3A
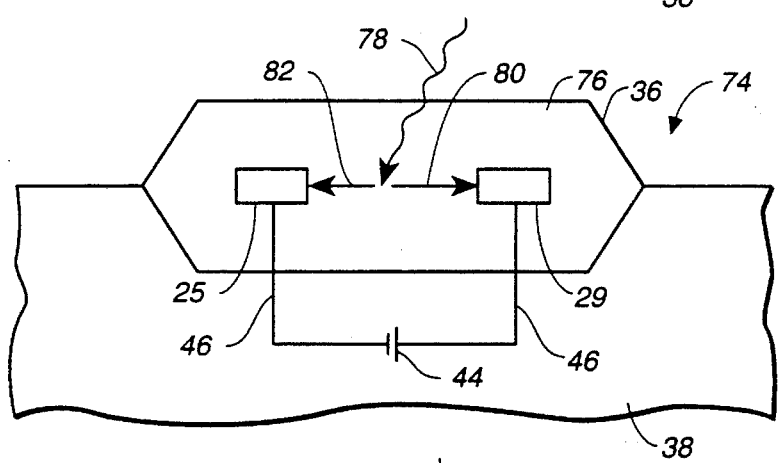
FIG._3B
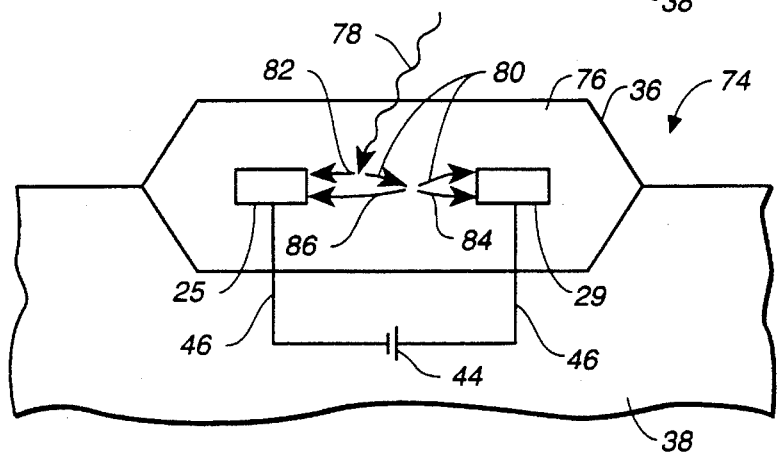
FIG._3C
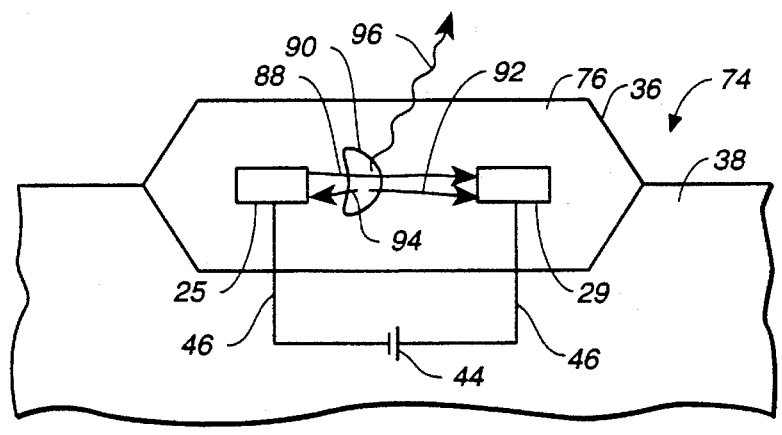
FIG._3D

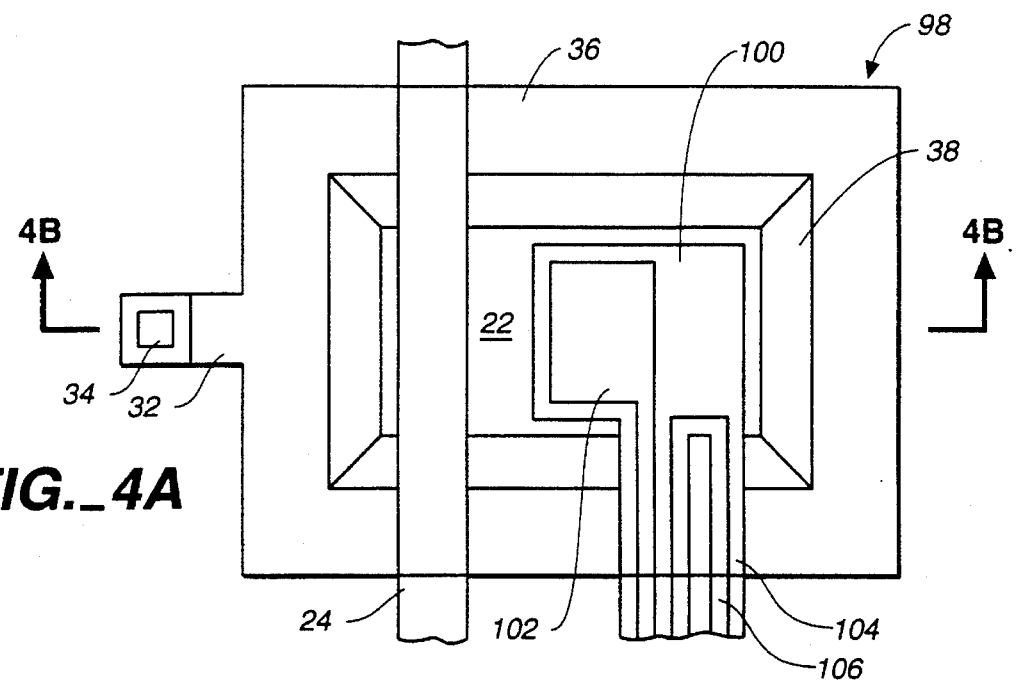
FIG._4A
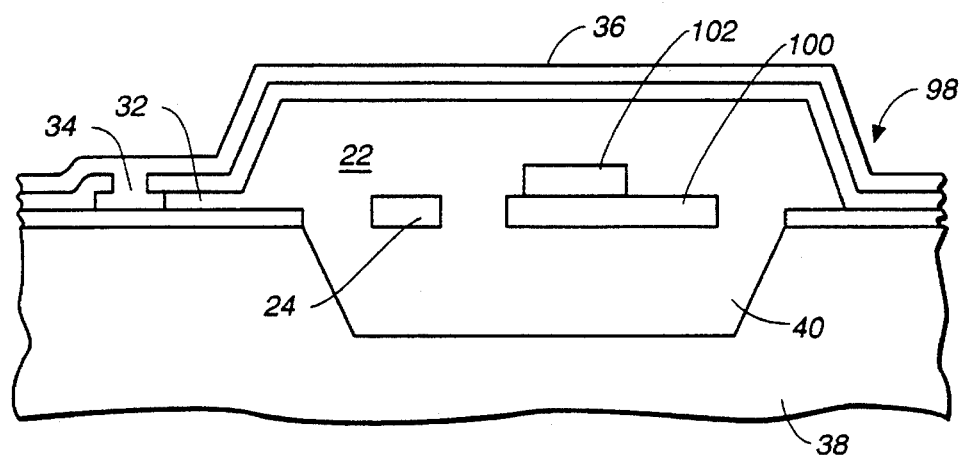
FIG._4B
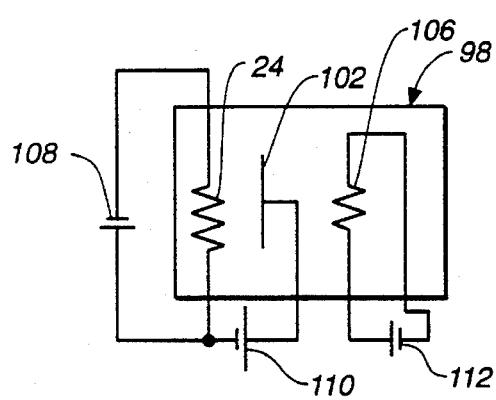
FIG._4C
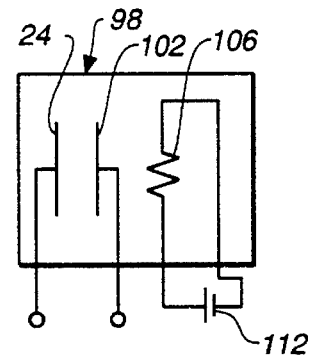
FIG._4D

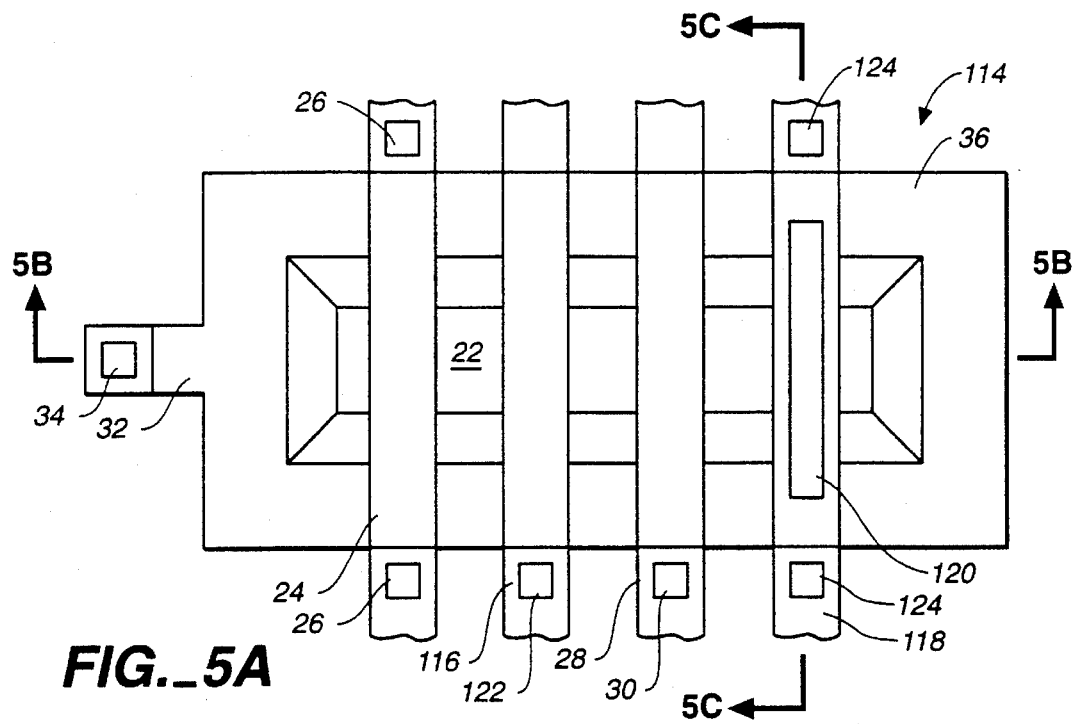
FIG._5A
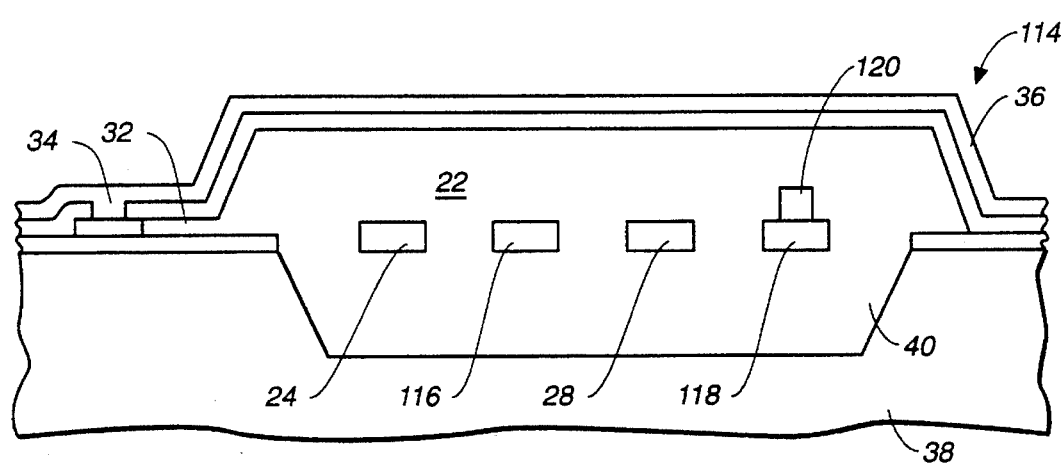
FIG._5B
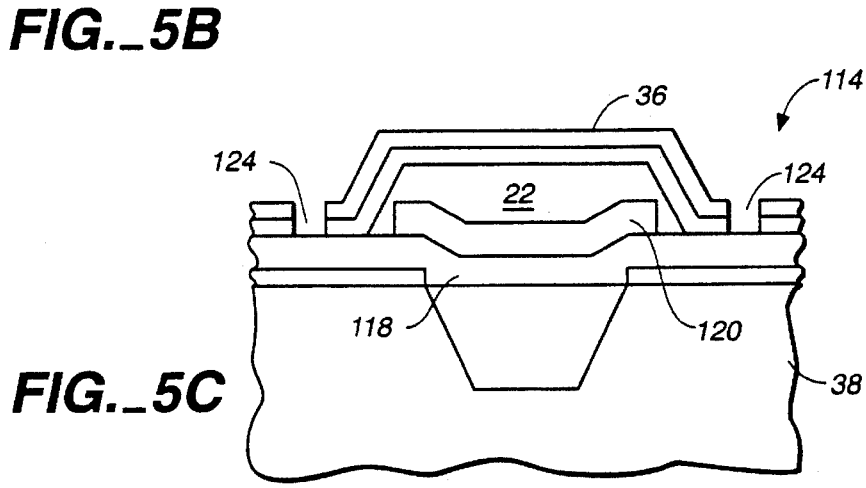
FIG._5C

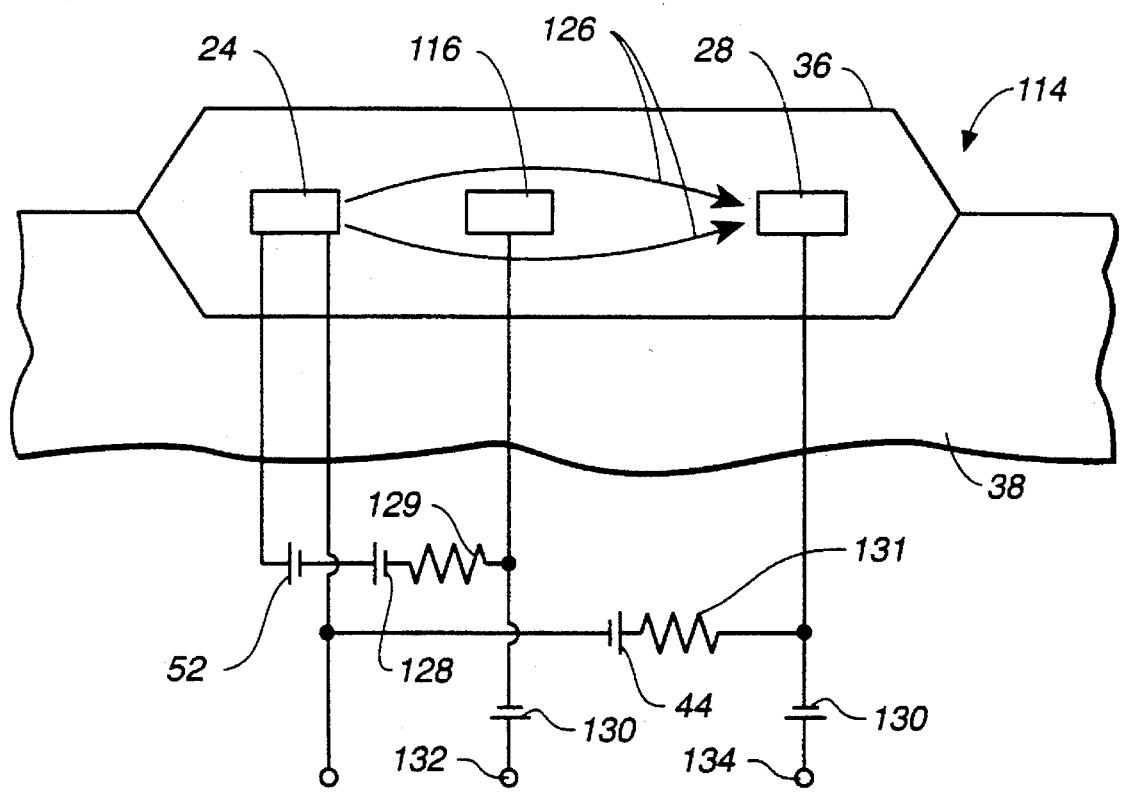
FIG._6

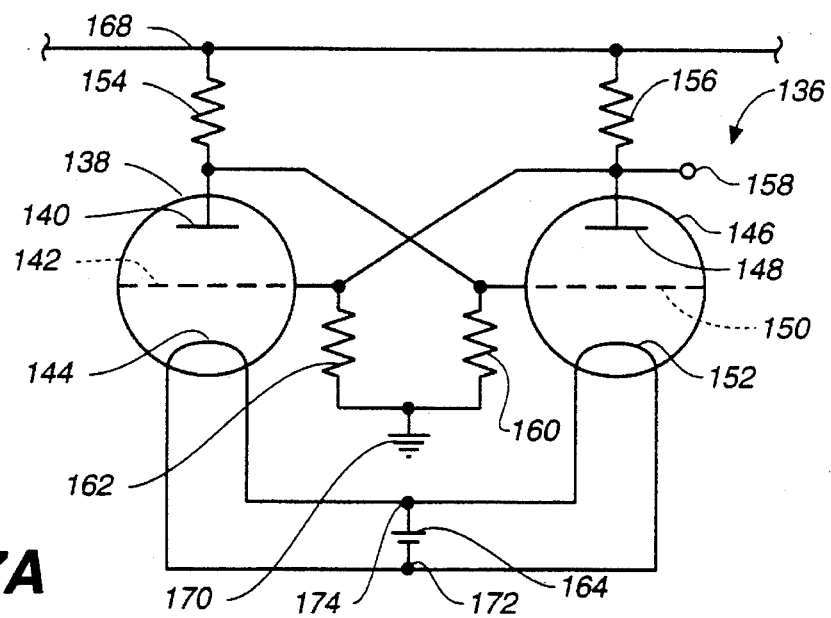
FIG._7A
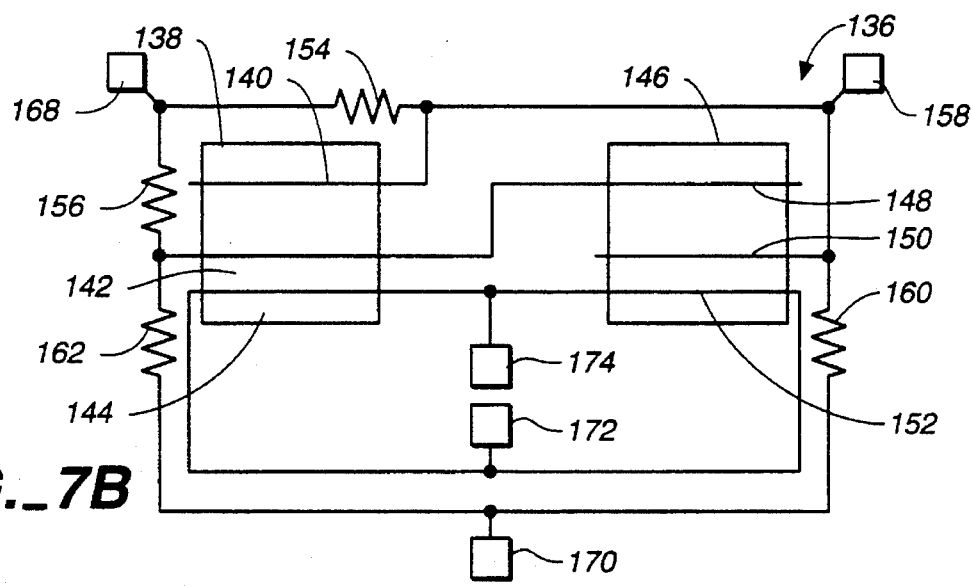
FIG._7B

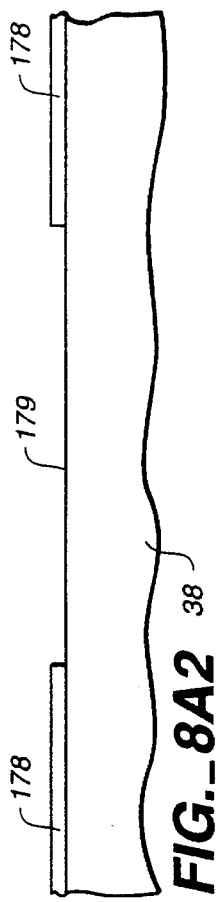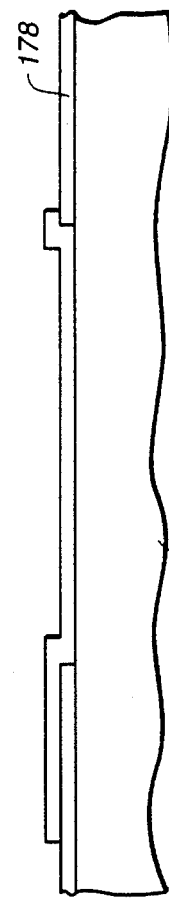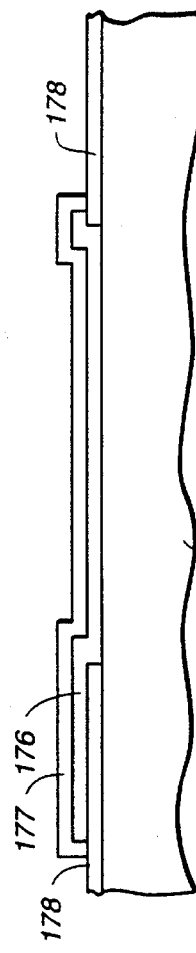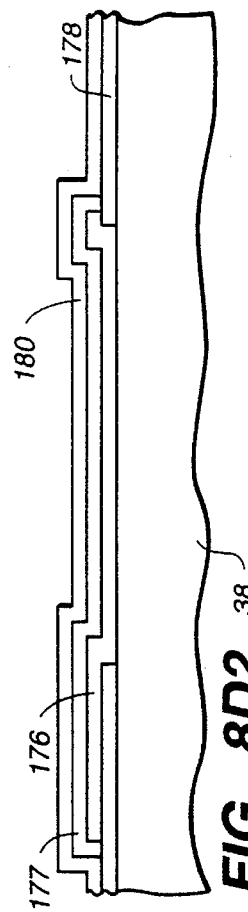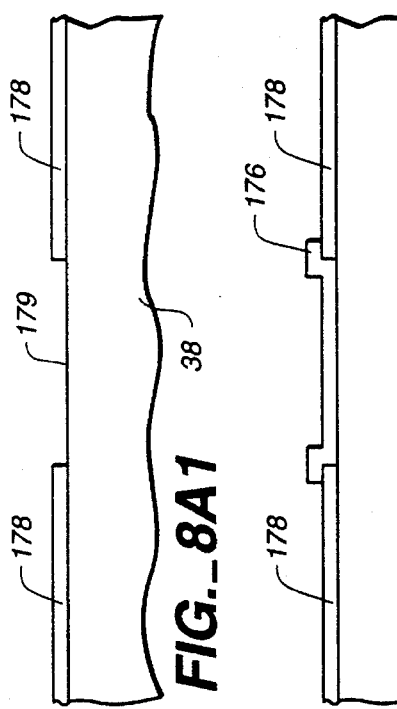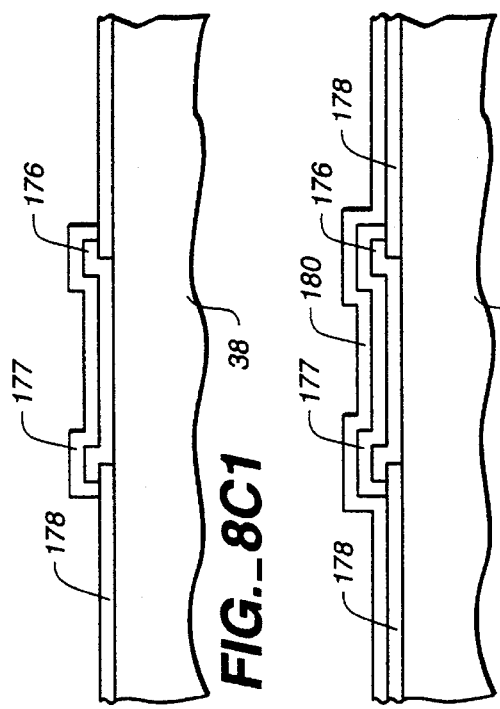

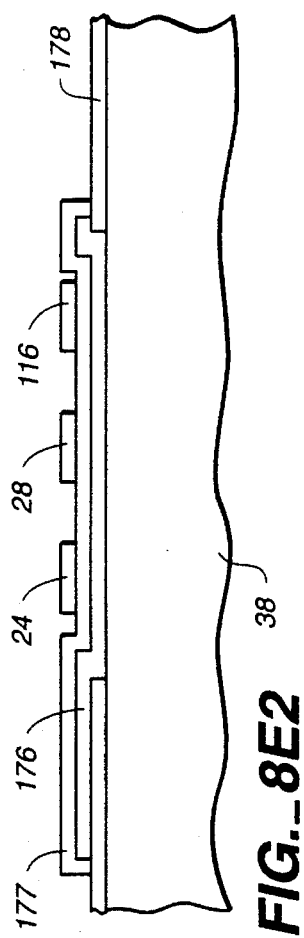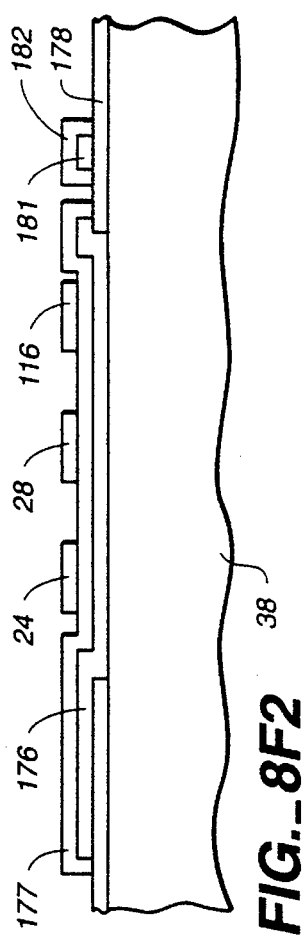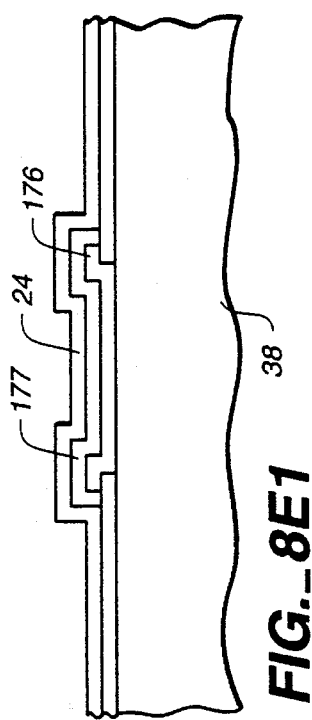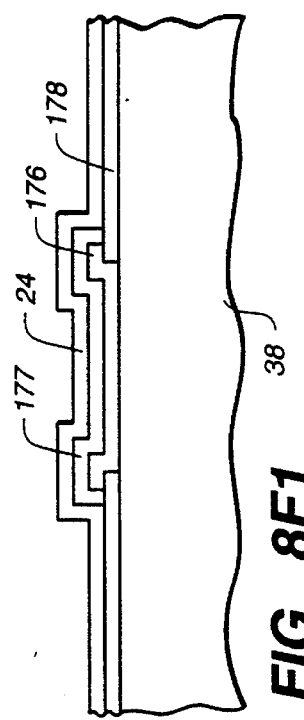
FIG._8E1
FIG._8F1
FIG._8E2
FIG._8F2

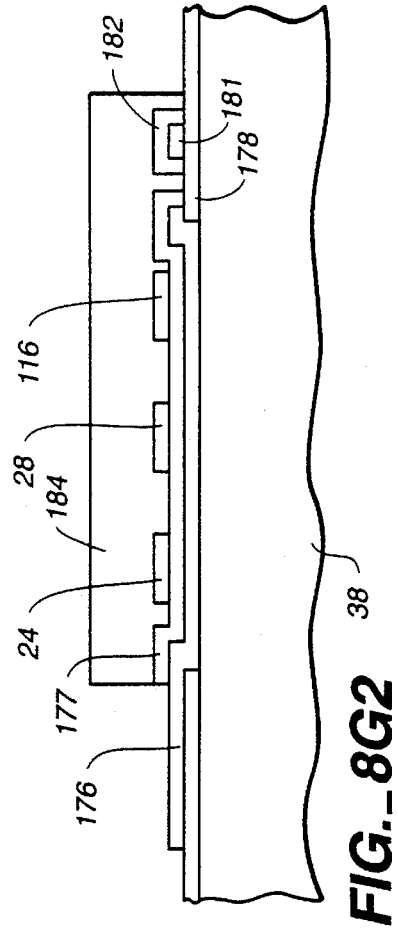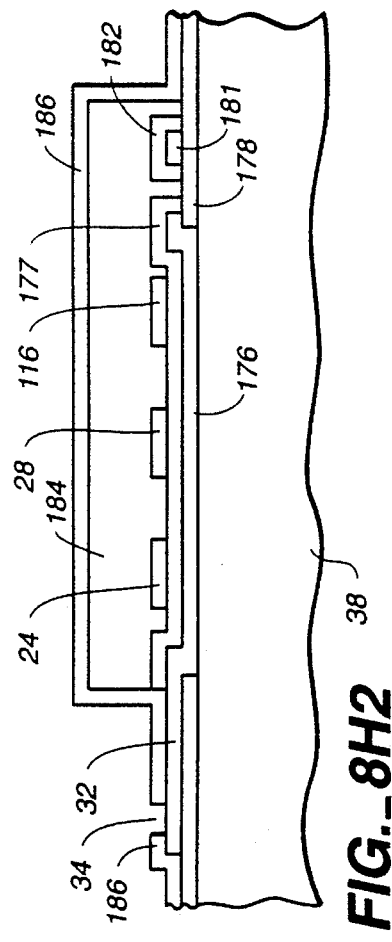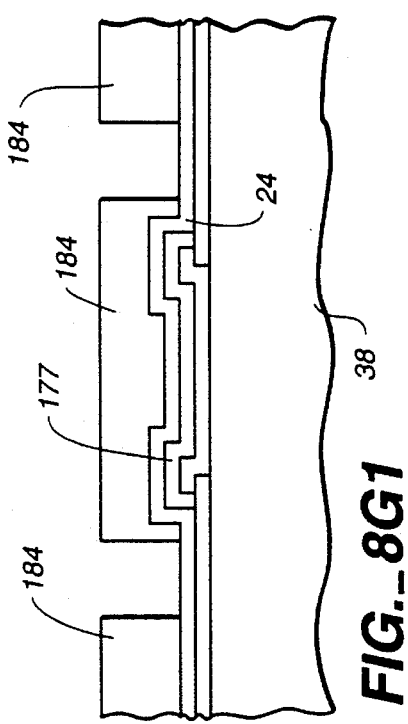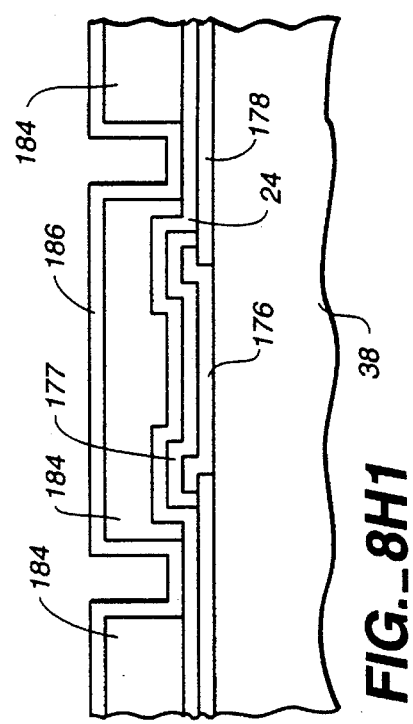

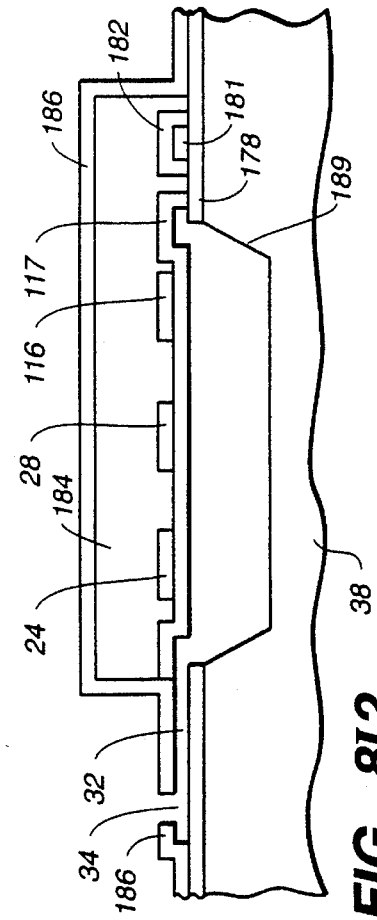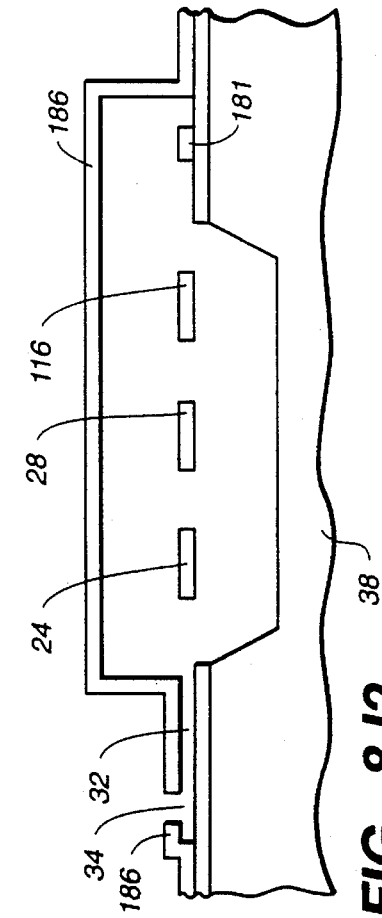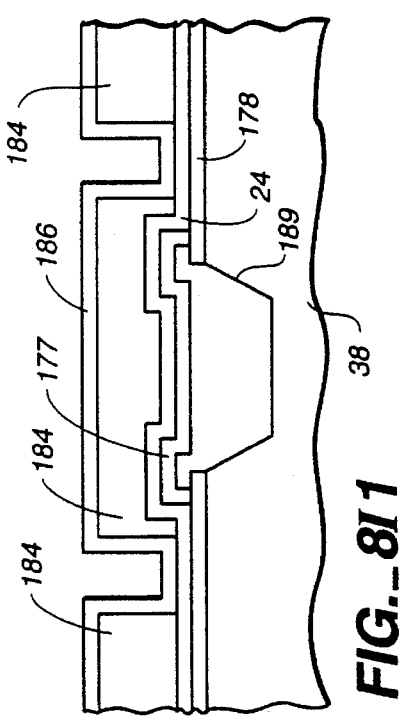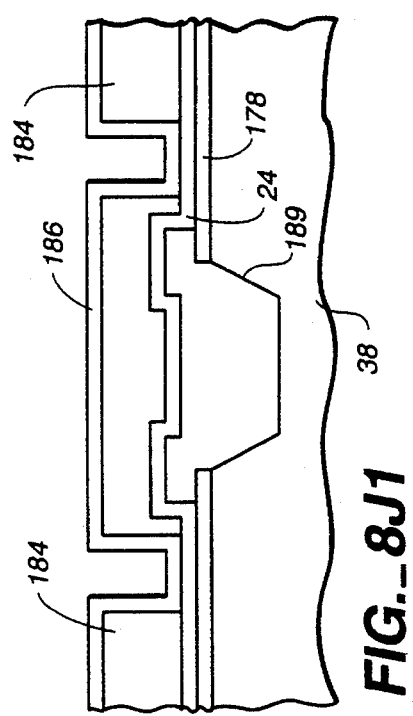

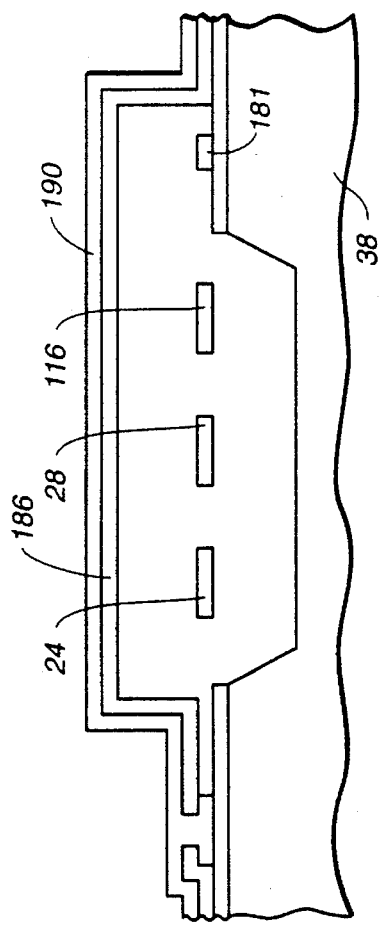
FIG._8K1
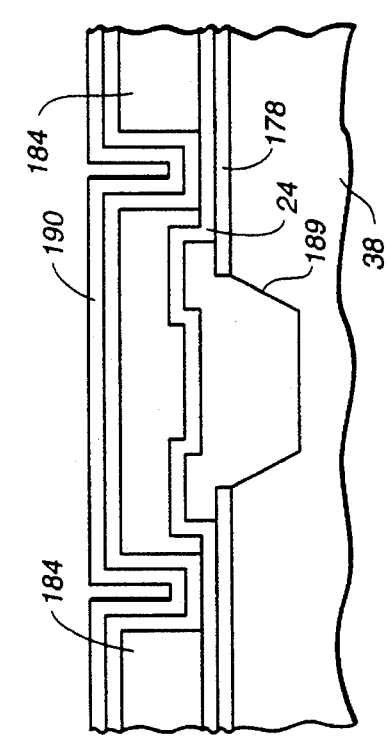
FIG._8K2
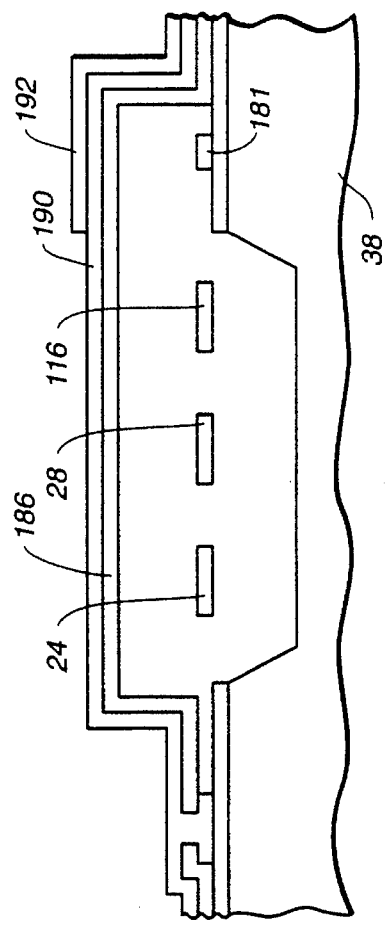
FIG._8L1
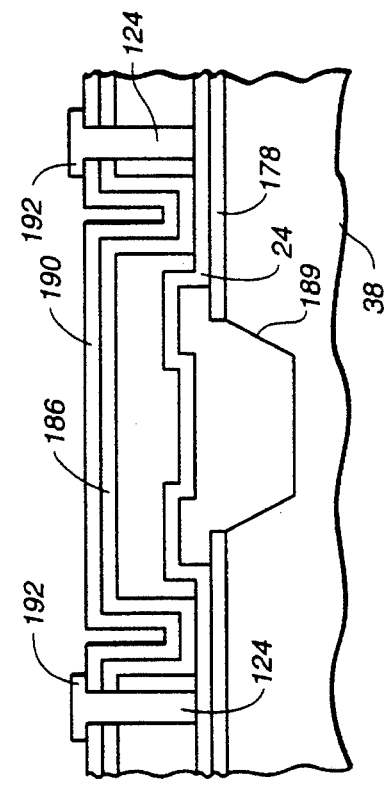
FIG._8L2

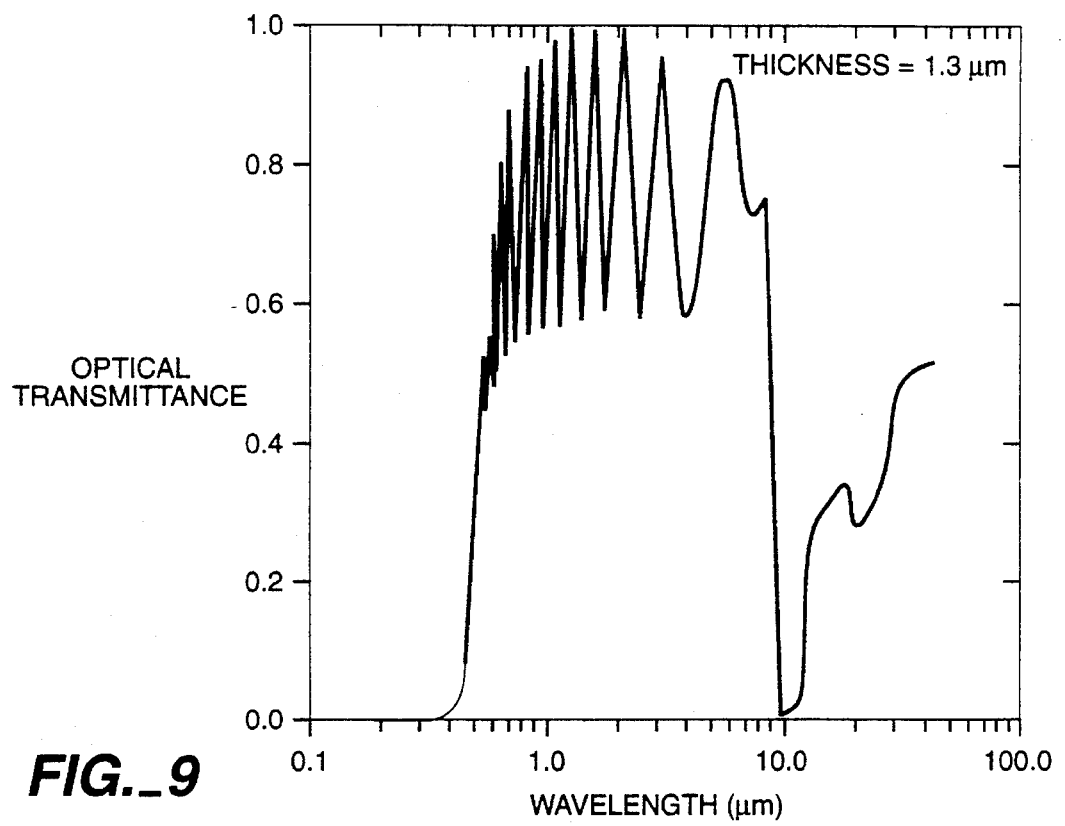
FIG._9
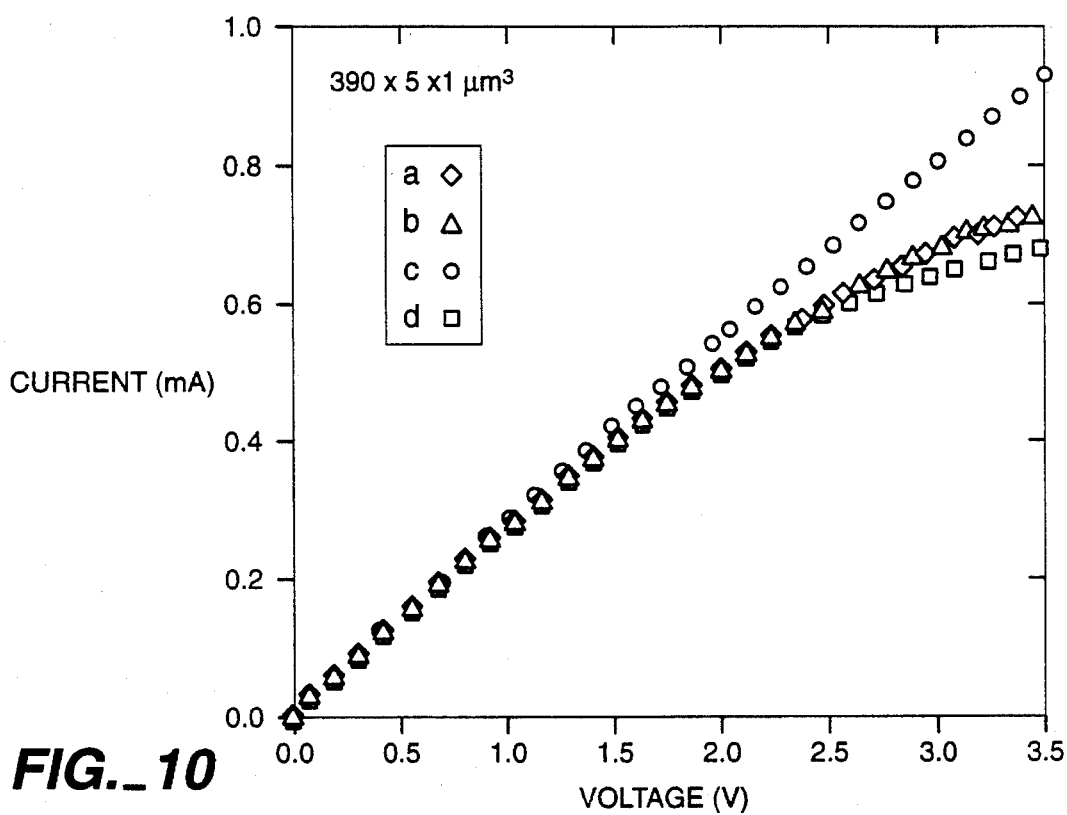
FIG._10

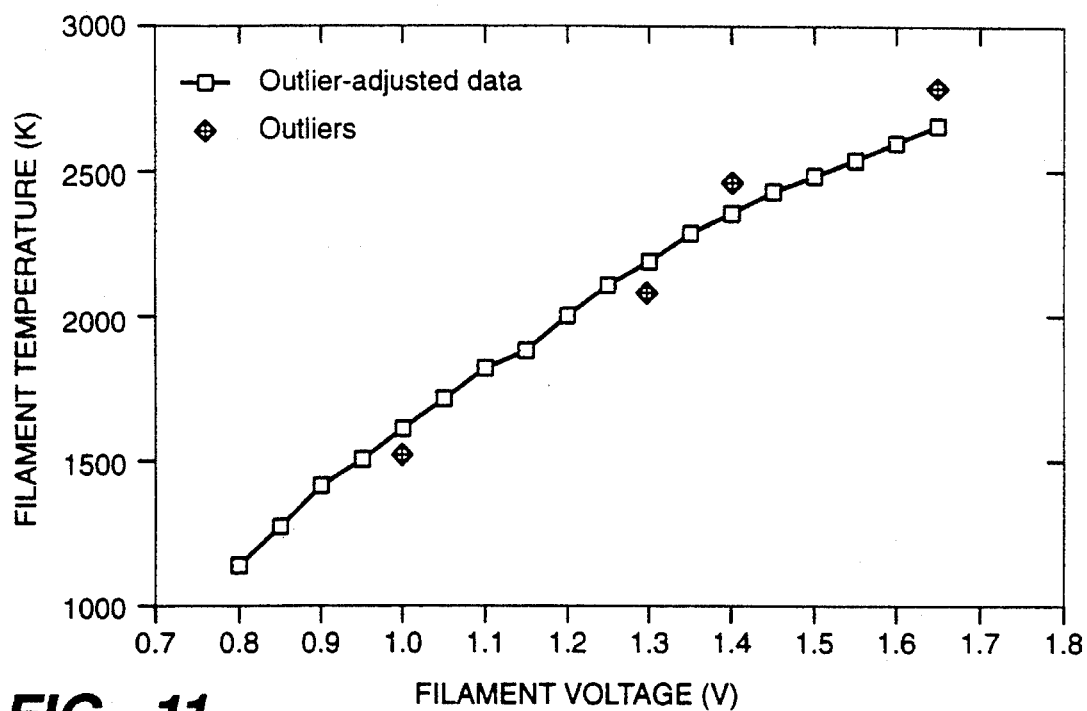
FIG._11  Outlier-adjusted temperature vs. voltage (with outliers)
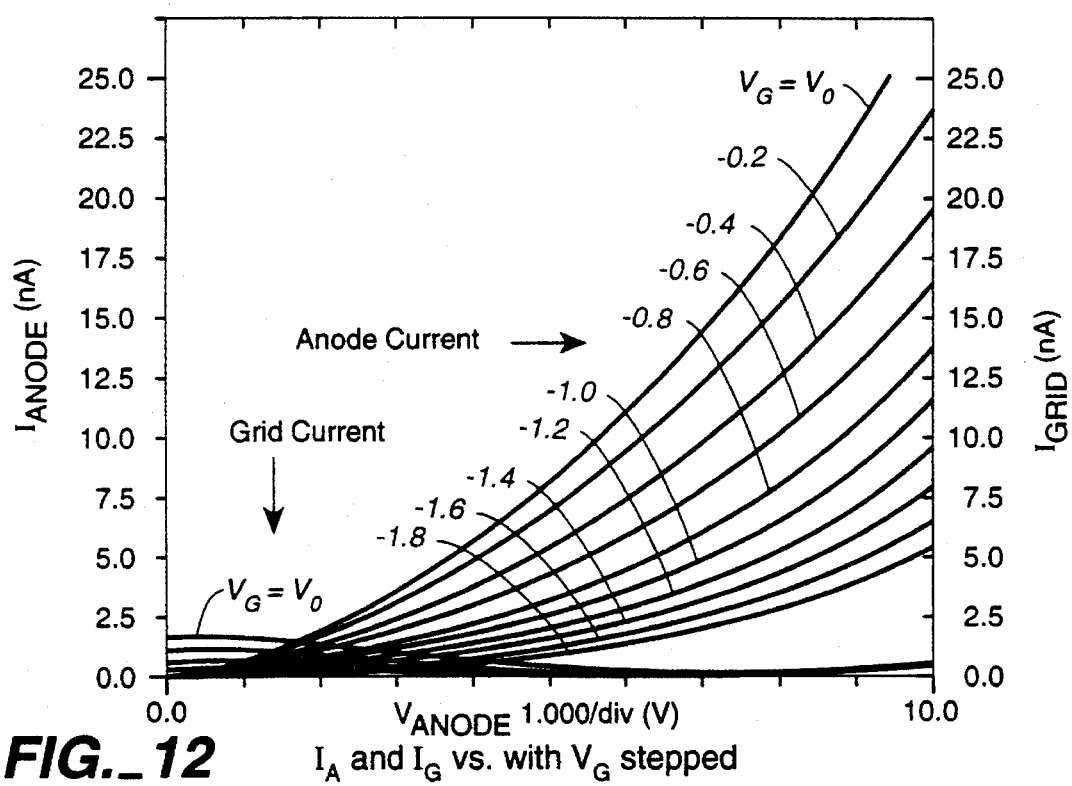
FIG._12  $I_A$ and $I_G$ vs. with $V_G$ stepped

SEALED MICROMACHINED VACUUM AND GAS FILLED DEVICES

CROSS-REFERENCE TO RELATED APPLICATIONS

This application is a continuation-in-part of U.S. patent application Ser. No. 07/621,678, filed Dec. 3, 1990 now U.S. Pat. No. 5,285,131.

BACKGROUND OF THE INVENTION

The present invention relates to micromachined devices, and more particularly to microstructures usable, for example, in vacuum microdevices.

Vacuum amplifying and switching devices offer several advantages over semiconductor devices for some applications. A vacuum itself cannot incur radiation damage, and vacuum emitters and collectors are relatively insensitive to radiative flux. Therefore, vacuum tubes may be employed in high-radiation environments, such as in nuclear-reactors, space, or other places where transistors may be destroyed. Also, unlike semiconductors (which suffer mobility degradation at elevated temperature), the performance of vacuum devices is not degraded in high temperature environments, such as oil and geothermal wells, engines, and nuclear reactors. Finally, due to the higher maximum velocity of electrons in a vacuum (order of $10^8$ m/s versus order of $10^6$ m/s in semiconductors), vacuum devices can potentially perform at higher frequencies.

The present invention mitigates the thermal problems which can be expected to arise in microfabricated thermionic-emission devices. These problems include heat loss and overheating of nearby devices. Because of such problems, researchers have focussed on non-thermionic field-emission vacuum devices, which typically have sharply pointed IC-processed cathodes and closely spaced grids. See, for example, Technical Program of Third International Vacuum Microelectronics Conference, IEEE, Monterey, Calif., July 1990. Anodes for these structures are usually added later mechanically, rather than by microfabrication techniques, making the devices more expensive to produce.

A smaller number of thermionic-emission devices with at least some of the electrodes on a single chip have also been fabricated. In the thermionic devices known heretofore, the entire substrate had to be heated and maintained in an evacuated enclosure. This, however, severely limits the systems that can be used with such devices since only devices which are functional at very high temperatures can be integrated on the substrate. See D. V. Geppert et al., "Low-temperature thermionic emitter," Interim Scientific Report (SRI Project PYU-7147), Stanford Research Institute, Menlo Park, Calif., May 19, 1969; and D. K. Lynn et al., "Thermionic integrated circuits: electronics for hostile environments," *IEEE Transactions on Nuclear Science*, Vol. 32, No. 6 (Dec. 1985), pp. 3996–4000.

Exposed suspended filaments have been fabricated for various uses including incandescent lamps. Due to the fact that, unlike the filaments of the present invention, these filaments are exposed, they have low power efficiency and limited device life. See, eg, U.S. Pat. No. 4,724,356, issued Feb. 9, 1988.

Empty sealed cavities consisting of a recess in a substrate and a sealing membrane along the surface of the substrate have been fabricated and are discussed in S. Sugiyama et al., "Micro-diaphragm pressure sensor," Tech. Digest, IEEE International Electron Devices Meeting, pp. 184–187, 1986.

Devices comprising exposed micromachined moving parts have been fabricated. In many cases, it would be advantageous to seal them to eliminate friction due to gases or liquids they may be immersed in, or damage from reactive or contaminating ambients.

In view of the foregoing, an object of the present invention is to provide a microstructure where the magnitude or the variability of friction, thermal conduction, chemical attack, or contamination to which a device is exposed is reduced.

It is a more specific object of the present invention to provide a microstructure where the magnitude or the variability of friction, thermal conduction, chemical attack, or contamination to which a device is exposed is reduced, wherein the device can be fabricated by conventional IC fabrication technology.

Yet another object of the present invention is to provide integrated circuits combining hot thermionic-emission device components with other devices which require lower temperatures and providing metallurgically compatible surroundings for the hot elements.

Additional objects and advantages of the invention will be set forth in the description that follows, and in part will be apparent from the description, or may be learned by practice of the invention. The objects and advantages of the invention may be realized and obtained by means of the instrumentalities and combinations particularly pointed out in the claims.

SUMMARY OF THE INVENTION

The present invention is directed to a microstructure comprising a sealed cavity bounded by a substrate. The cavity includes a low pressure ambient. A member is suspended inside the cavity.

The ambient may be a vacuum or low pressure gas, whereby the thermal conduction from the member, the damping of the member's motion and variations in the cavity ambient are reduced. Device elements to be encapsulated can be fabricated as part of the suspended member by conventional thin-film processing methods. Either subsequent to or concurrent with the fabrication of the cavity, additional devices can be fabricated outside the cavity.

If the ambient is a vacuum and the cavity contains a refractory cathode filament and an anode, the resulting structure is a thermionic-emission vacuum diode which can be used, for example, as a rectifier or sensor of externally applied electric and magnetic fields. Grid electrodes can be provided, either inside or outside the cavity, to build triodes, tetrodes, pentodes, hexodes or traveling wave tubes. Electromagnetic radiation can be generated by an anode comprising a cathodoluminescent material.

A gas-filled cavity with two electrodes can be used as a gas discharge radiation source. The gas can be provided by sealing the cavity with a process such as chemical vapor deposition or sputtering, which takes place in the presence of a gas. Addition of a photoluminescent material can be used to change the wavelength of the radiation being produced. Such light sources have potential uses in communications, displays and diagnostics, such as spectroscopy.

A gas-filled cavity with two electrodes can also be used as a Geiger counter. Ionizing radiation would be detected by pulses of current when the device is appropriately biased.

BRIEF DESCRIPTION OF THE DRAWINGS

The accompanying drawings, which are incorporated in and constitute a part of the specification, schematically illustrate preferred embodiments of the invention and, together with the general description given above and the details of the preferred embodiments given below, serve to explain the principles of the invention.

FIG. 1A is a schematic plan view of a vacuum diode or gas-filled tube in accordance with the present invention.

FIGS. 1B and 1C are cross-sectional views of the device of FIG. 1A taken along the lines 1B—1B and 1C—1C, respectively.

FIGS. 2A–2F schematically illustrate device configurations using a vacuum diode with the structure described in FIGS. 1A–1C.

FIGS. 3A–3D schematically illustrate device configurations using a gas-filled tube with the structure described in FIGS. 1A–1C.

FIG. 4A is a schematic plan view of a vacuum sealed accelerometer or electromechanical resonator in accordance with the present invention.

FIG. 4B is a cross-sectional view of the device of FIG. 4A taken along the line 4B—4B.

FIGS. 4C and 4D are electrical schematics of the device of FIGS. 4A and 4B when used as an accelerometer or a resonator.

FIG. 5A is a schematic plan view of a triode in accordance with the present invention.

FIGS. 5B and 5C are cross-sectional views of the triode of FIG. 5A taken along the lines 5B—5B and 5C—5C, respectively.

FIG. 6 schematically illustrates how a triode can be used in an amplifier.

FIGS. 7A and 7B are the schematic and layout, respectively, of an integrated microsystem comprising two devices according to the present invention integrated with other devices.

FIGS. 8A1–8L2 schematically illustrate a triode fabrication process according to the present invention. The left-hand figures (ending with a 1) are cross-sections along an electrode, similar to the cross-section in FIG. 5C of the device of FIG. 5A. The right-hand views (ending with a 2) are cross-sections across all of the electrodes, similar to the cross-section in FIG. 5B of the device of FIG. 5A.

FIG. 9 is a graphical representation of the measured optical transmission spectrum for a 1.3 μm thick low-stress silicon nitride membrane.

FIG. 10 is a graphical representation of I–V curves for a polysilicon filament sealed microlamp: (a) in a pumped vacuum chamber at 1 atm, (b) in a pumped vacuum chamber at 5 μT, (c) in a pumped vacuum chamber at 1 atm for a punctured microlamp, (d) in a pumped vacuum chamber at 5 μT for a punctured microlamp.

FIG. 11 is a graphical representation of a tungsten filament's maximum temperature as a function of the voltage across the filament.

FIG. 12 is a graphical representation of anode and grid currents of a triode as a function of anode voltage and grid voltage.

DESCRIPTION OF THE PREFERRED EMBODIMENTS

Vacuum diode

Turning now to the drawings, wherein the same reference numerals are used for the same element in the various embodiments, a preferred embodiment of the present invention is a vacuum diode or gas-filled tube 20 as illustrated in FIGS. 1A–1C. The device is fabricated on a planar face of a substrate 38 which may have a recess 40. The recess is covered by a thin-film membrane 36 whereby a hermetically sealed cavity 22 is formed. Two electrodes 24 and 28 are suspended in the cavity such that they contact the cavity boundaries 21 only at their ends 23. Contact holes 26 allow an electrical current to be passed through electrode 24. Similarly, an electrical connection to electrode 28 can be made through contact hole 30. An etching hole 34 and etching channel 32 are necessary to fabricate this structure as discussed below in the description of the fabrication process. Cavity 22 can contain essentially a vacuum or a gas ambient.

Device configurations using a vacuum diode are illustrated in FIGS. 2A–2F. If the temperatures of both electrodes are relatively low, negligible current flows when a moderate voltage is applied between the electrodes as shown in FIG. 2A, where voltage source 44 is connected to the electrodes of a diode 42. The electrode 24 may be negatively-biased relative to electrode 28, and constitute a cathode, while electrode 28 constitutes an anode. An energy of several electron volts must be imparted to an electron in order to remove it from the electrode. This energy, known as the work function, is material dependent and its value is known for most materials of interest. Since electrons cannot leave the cathode, there is no current.

One possible way to supply the needed energy is through the photoelectric effect, wherein the cathode is illuminated with sufficiently high frequency electromagnetic radiation 48 as shown in FIG. 2B. For most materials, this radiation is in the ultraviolet range, but for some it is in the visible light range. The absorption of a photon of the radiation 48 by cathode 24 may allow one electron to leave the cathode and flow to anode 28 as shown in FIG. 2B by the path 50. The vacuum diode can therefore be used as a phototube.

Another way to supply sufficient energy to liberate electrons from the cathode is to heat the cathode which then must consist of a refractory material such as tungsten, tantalum, platinum, palladium, molybdenum, zirconium, titanium, nickel or chromium. In order to limit the power dissipation in the cathode and avoid overheating any nearby devices integrated on the same substrate 38, cathode 24 must be suspended as provided by the present invention.

In FIG. 2C, cathode 24 is heated by passing a current produced by source 52 and carried by leads 54, connected to the ends of the cathode. At a high enough cathode temperature, a significant number of outwardly moving electrons will have kinetic energy greater than the work function of the cathode material and be able to flow to anode 28 as shown by path 50. At the same time, cathode 24 will glow emitting electromagnetic radiation 56. If the polarity of voltage source 44 is reversed, no current can flow through the device since the anode is cold. This device can therefore function as a rectifier.

FIG. 2D shows the effect of a magnetic field perpendicular to the plane of the figure, directed into the page, and also perpendicular to the direction of electron flow through diode 42. The trajectories 58 of the electrons are curved in a plane perpendicular to the direction of the magnetic field. The bend in the trajectories leads some electrons to collide with the walls 59 of diode 42, reducing the current flowing between anode 28 and cathode 24. This phenomenon allows measurement of magnetic fields. It should be appreciated that other device geometries can be used as well.

An externally applied electric field can also alter the trajectory of the electrons as shown in FIG. 2E, where an external electrode 62 is negatively biased relative to the cathode using source 64 and leads 66. The electrons are repelled, resulting in a decrease in the current through diode 60. As such, diode 60 can be used to evaluate electric fields. It should be appreciated that other device geometries can be used as well. It may also be possible to use the same device as an amplifier by applying an input signal to external electrode 62, or, if several external electrodes forming a slow wave transmission line are provided, as a traveling-wave tube.

If the surface of anode 28 consists of a cathodoluminescent material, it will glow with a well defined spectrum emitting radiation 72 when impacted by electrons as shown in FIG. 2F. A diode 70 having such an anode can therefore be used as a light source. It will be appreciated that the anode does not have to be suspended. For example, if the sealing membrane is made of a conductive material such as polysilicon, it could advantageously be used as the anode to generate radiation over a greater area.

An additional filament with a getter material can be provided for improving the vacuum as described below in the fabrication section.

Gas-filled tube

FIGS. 3A–3D show a gas-filled tube 74 similar to diode 42, including a cavity 76 filled with a low pressure gas, cathode 25 and anode 29. For sufficiently high voltage applied between cathode 25 and anode 29 via voltage source 44 and electrical connections 46, a self-sustaining glow discharge may occur as shown in FIG. 3D. A plasma plume 90 may be present near cathode 25. The plume contains gas ions and electrons in addition to neutral gas atoms. Some of the electrons are emitted by cathode 25 when an ion impacting it supplies sufficient energy to an electron to overcome the work function of the cathode. The electron then moves toward the anode along trajectory 88. The electron is accelerated and can collide with gas atoms along the way, generating additional electrons and ions moving, for example, along trajectories 92 and 94, respectively. For the above ionization to occur frequently, the linear dimensions of the cavity should be substantially greater than the electron mean free path so the electron can collide with an atom before colliding with a cavity wall, and the electric field should be sufficient to accelerate an electron, over one mean free path, sufficiently to render it able to ionize a gas atom. If the ion impacts the cathode, another electron can be liberated. The plasma plume typically emits radiation in the visible or ultraviolet, making this device useful as a light source.

When the voltage between the electrodes is insufficient to sustain the glow discharge, the device can be used as an ionizing radiation detector, as shown in FIGS. 3A–3C. In the absence of ionizing events, no current flows between electrodes 25 and 29 (FIG. 3A). Ionizing radiation 78 such as X-rays can ionize a gas atom. The resulting ion and electron then move along trajectories 82 and 80 toward the cathode 25 and anode 29, respectively, as shown in FIG. 3B. If the voltage between the electrodes is high enough, the electron can ionize additional atoms as shown in FIG. 3C where the electron moving over the trajectories 80 ionizes an atom with the resulting ion moving along trajectory 86 and an additional electron moving along trajectory 84. In any event, there is a current pulse through the device allowing ionizing radiation to be detected.

Electromechanical device

A vacuum device with at least one flexible electrode can function as a mechanical sensor or resonator. FIGS. 4A and 4B show such a structure 98, but it should be appreciated that these structural details of device 98 can be varied without departing from the scope of the invention. Like the diode described above, this device has a filament electrode 24 suspended in a cavity 22. Another suspended electrode 102 rests on a polysilicon mass 100 at the end of a polysilicon cantilever beam 104. The beam also carries a heater resistor 106. Since the cavity is evacuated, the damping of the motion of the member comprising mass 100 and beam 104 is greatly reduced, allowing the device to function as a more sensitive sensor or higher quality factor resonator. The heat conduction between beam 104 and substrate 38 is also reduced since there is no conduction or convection through a gas in the cavity, and the temperature of the beam can then be easily controlled using heater resistor 106 with reduced power dissipation and temperature gradients along the beam, thus controlling the beam's stiffness and increasing the stability of the device. The temperature of the beam can be monitored using the same heater resistor 106, whose resistance varies with the temperature, as a temperature sensor.

FIG. 4C shows an electrical schematic of the device when used as an accelerometer. Filament 24 is resistively heated using source 108, as was described for the diode, and biased negatively with respect to electrode 102 using source 110. The beam holding electrode 102 is heated using source 112 and heater resistor 106. The magnitude of the current between electrodes 24 and 102, which function as the cathode and anode of a vacuum diode, depends on their spacing. As the beam 104 (FIG. 4A) bends in response to accelerations of the substrate 38, the current between filament 24 and electrode 102 varies, allowing the acceleration to be evaluated.

In FIG. 4D, an electrical schematic of the device when used as a resonator is shown. In this case, filament 24 is not heated, and no conduction current flows through it. Electrodes 24 and 102 in combination form an electrostatic voltage-to-force transducer. The resulting force drives the resonator composed of the mass 100 carrying electrode 102, and the beam 104 heated by heater resistor 106 powered by source 112. The response of the resonator is the displacement current flowing through electrodes 24 and 102 as the voltage across them and their distance varies. The vacuum permits a higher quality factor and, together with heating resistor 106, facilitates the control of the temperature of the mechanical resonator as described above for the accelerometer.

An additional filament with a getter material can be provided for improving the vacuum as described below in the fabrication section.

Vacuum tubes with grids

The structure of a device 114 which is similar to the diode of FIG. 1 but with an additional grid electrode 116, according to the present invention, is shown in FIGS. 5A–5C. A grid electrode is a vacuum tube electrode, normally biased negative relative to cathode 24, situated close to the path of the electrons as they leave the cathode. As the grid voltage is decreased, the electric field at the cathode decreases, resulting in a decrease in current 126 (FIG. 6) flowing through tube 114. Relatively small changes in the grid voltage cause relatively large changes in the anode current. The grid therefore can be used as the input in amplifying vacuum tube circuits. Because a negatively biased grid repels electrons, the grid current is near zero under normal operating conditions. FIGS. 5A–5C show an additional filament 118 carrying a titanium pad 120. This filament can be used to improve the vacuum in the cavity through gettering of residual gases, as described below in the fabrication section. Connections to the electrodes can be made through contact holes 26, 30, 122 and 124 through the sealing membrane 36.

FIG. 6 illustrates the use of a triode 114 in an amplifier stage. The device is biased with voltage source 128 and resistor 129, controlling the DC grid-to-cathode voltage, and voltage source 44 and resistor 131, controlling the anode-to-cathode voltage. Amplifier input 132 and output 134 are connected to grid 116 and anode 28, respectively, through capacitors 130. The cathode filament is heated using source 52.

It should be appreciated that additional grid electrodes can be provided without departing from the scope of this invention.

Integrated microsystems

Multiple devices of the present invention can be fabricated simultaneously on the same substrate and integrated with other electronic devices to form inexpensive integrated microsystems.

As an example, the schematic and layout of an Eccles-Jordan multivibrator are shown in FIGS. 7A and 7B. The system comprises triodes 138 and 146 like those of FIGS. 5 and 6, and resistors 154, 156, 160 and 162. Triode 138 has cathode 144, grid 142 and anode 140. Similarly, triode 146 has cathode 152, grid 150 and anode 148. Each triode's anode is connected to the output of the other triode and the resulting circuit has two stable states in each of which one of the triodes has a significant anode to cathode current. The four resistors and voltages applied at nodes 168, 170, 172 and 174 are used to bias the device. A node tied to the grid of a triode, such as node 158, can be used to sense as well as to change the state of the circuit.

A possible layout of the system is shown in FIG. 7B. The outlines of triodes 138 and 146 are shown as two rectangles. The other lines represent polysilicon resistors, vacuum tube electrodes, their interconnections, and contact pads.

Fabrication process overview

A microstructure according to the present invention as shown in FIGS. 1A–1C, 4A–4B, and 5A–5C can be fabricated, as described in greater detail in the following section and FIGS. 8A1–8L2, by starting with a substrate 38 with an etchable sacrificial layer over at least part of the surface (here polysilicon layer 176 as well as the top of the substrate 38 exposed in window 79 of unetchable layer 178) (FIG. 8B1-2). The exposed surface may be substantially planar. Devices or device elements to be encapsulated can be fabricated on the surface by conventional thin-film processing methods. The exposed surface of the structure to be encapsulated should not be etchable by the etchants used to remove the sacrificial layer. A second sacrificial layer 184 (FIGS. 8G1–8I2) is then grown, which together with the first sacrificial layer defines the volume of the cavity, including etching channels 32 which provide access to the etchant and are easy to seal afterwards. A thin film 186 (FIG. 8H1-2) is then deposited as part of the cavity seal. Etching holes 34 are opened at the ends of the etching channels. The cavity 22 is formed and the enclosed member freed by etching the sacrificial layers. After providing the desired ambient, additional material 190 (FIG. 8K1-2) is deposited to close the etching holes and seal the cavity. If desired, a process such as gettering can be initiated to alter the ambient, such as by heating a titanium film. Either subsequent to or concurrent with the above steps, outside devices can be fabricated.

DETAILED DESCRIPTION OF A FABRICATION PROCESS

All the integrated-circuit processing steps necessary for the fabrication of a tungsten electrode vacuum tube, as well as their mutual compatibility, have been tested by using tungsten electrode triodes and vacuum-sealed coated polysilicon filament microlamps as test devices. The invention, however, can be practiced with devices other than triodes and microlamps, and materials other than tungsten. The polysilicon filament microlamps are described in above-identified U.S. patent application Ser. No. 07/621,678 filed Dec. 3, 1990, the disclosure of which is hereby incorporated by reference.

A microstructure 114, in which cathode 24, grid 116, anode 28, and gettering electrode 118 are coplanar and parallel filaments, is shown in FIGS. 5A–5C. Possible device dimensions are, for example, a 200 µm filament length, a 1 µm filament thickness, a 3 µm cathode width, a 3 µm cathode-to-grid spacing, a 5 µm grid width, a 10 µm grid-to-anode spacing, and a 15 µm anode width. All linear dimensions of the device may therefore be less than 500 µm. Such planar devices can be processed by standard IC techniques. Furthermore, because the filaments are parallel to each other and to the substrate, as many filaments as desired can be spaced side by side in a device to form diodes, triodes, tetrodes, etc. Micromachining such multi-electrode devices would be appreciably more complicated with vertical structures.

The dimensions given above were chosen as follows. It is desired that the resistively heated filaments have large areas to achieve both high luminous output and large thermionic emission currents. For a given area, making the filament function simultaneously as the high-resistance portion of the heating circuit, to minimize losses, dictates using a large length/width aspect ratio. Long, narrow filaments must be used to fulfill these criteria. Fortunately, long filaments can be heated to incandescence more efficiently than short ones because for sufficiently long filaments the heat loss through conduction through the ends of the filament is independent of the length of the filament. A nominal filament length of 200 µm was chosen as a compromise between output and efficiency, and manufacturability and durability. Very long filaments are easily broken during processing and handling. Experience has shown that 200 µm beams will survive fabrication and handling.

A relatively wide anode was chosen so that the surface area for electron collection would be large. Short cathode-to-grid and longer grid-to-anode spacings were chosen in an attempt to achieve a large multiplication factor. However, as the grid-to-anode spacing is increased, the anode current becomes smaller, so very long grid-to-anode spacings are therefore not useful.

An additional filament 118 carries a titanium pad 120 which can be heated for residual gas gettering in order to improve the vacuum inside the cavity. This filament 118 is not activated when the triode 114 is operated.

The rest of the vacuum microdevice structure exists to support the filaments while providing thermal and electrical isolation. Thermal isolation is accomplished by suspending the filaments inside cavity 22 in silicon substrate 38 (FIG. 8I1-2). An improved thermal isolation scheme would involve a long, low-heat-conductance path at the ends of the filaments. Electrical isolation is achieved by placing the conductors on a dielectric layer 178 of silicon nitride.

The cavity in the silicon substrate must be deep enough that the hot tungsten filaments do not touch the bottom when they lengthen due to thermal expansion. When heated from room temperature to just below its melting point, tungsten expands 2.2%. This expansion will cause a hot 200 μm filament to buckle several micrometers out of its original plane. The cavity depth in this process is 20 μm to ensure that the bottom is not touched.

Fabrication may begin with (100)-oriented, p-doped, 5–20 Ω. cm, 100-mm- (4-inch-) diameter silicon substrate 38 (see FIG. 8A1-2). The doping type is not important as long as the doping is light, in which case the conductivity of the walls of the recess in the substrate will be low. If high conductivity of the walls is desired, the doping should be heavily n-type rather than p-type. The (100) orientation is critical in this particular process because it allows the proper formation of the cavity, as described below.

A 0.5 μm thick silicon-rich LPCVD silicon nitride layer 178 (written here as $Si_xN$), which has a lower residual stress than that of stoichiometric $Si_3N_4$, is deposited. The $Si_xN$ is etched in phosphoric acid at 160° C., using a photolithographically patterned phosphosilicate glass (PSG) masking layer, leaving behind a rectangular window 179 where the device is to be formed (FIG. 8A1-2). PSG can be etched with hydrofluoric acid using photoresist as a mask.

Next, a polysilicon layer 176 is deposited and patterned using a 50:20:1 mixture of nitric acid, water and hydrofluoric acid (FIG. 8B1-2). The resulting pad 176 will form an etching channel for wet etching the interior of the cavity (not shown in FIG. 8B1-2) as described below. The top of the pad 176 is oxidized to protect the subsequently fabricated filaments above it from the silicon etchant when the pad 176 is etched. As a result, oxide layer 177 is formed (FIG. 8C1-2).

Pure tungsten has poor adhesion to $Si_xN$ (and even worse adhesion to $SiO_2$), so a thin (approximately 0.1 μm) adhesion layer of titanium-tungsten alloy (Ti/W) is sputtered onto the wafer first (not shown). Titanium (along with aluminum) is one of the few metals that will reduce $Si_xN$ or $SiO_2$, providing a thin transition layer with good adhesion.

Next, a 0.7 μm film 180 of LPCVD tungsten is deposited using hydrogen reduction of $WF_6$ at 490° C. (FIG. 8D1-2). These deposition conditions are designed to yield a low residual tensile stress. The tungsten is then masked and etched in an $SF_6$ plasma, leaving behind tungsten filaments 24, 28 and 116 (FIG. 8E1-2).

At this stage, the top surfaces of filaments 24, 28 and 116 are exposed. The present invention provides for an unlimited number of IC processing steps to be carried out to form devices or device components on the surface of the suspended members 24, 28 and 116. In this case, however, no further steps are necessary.

If parts of the suspended members 24, 28 and 116 are attacked by the sacrificial layer etchant, a protective layer can be deposited, prior to their fabrication, under them, and subsequent to their fabrication, over them. The present invention is therefore not restricted to suspended members free of any materials etchable by the sacrificial layer etchant. In this example, a silicon dioxide layer was provided under the tungsten in order to protect it from the silicon etchant.

A 1 μm-thick titanium filament 181 (FIG. 8F1-2), to be used later as a getter, is next formed on the silicon nitride 178 and masked with a layer of polysilicon 182. The titanium 181 is etched using a 20:1:1 mixture of water, hydrofluoric acid and hydrogen peroxide.

The volume of the cavity above the filaments 24, 28, 116 and 181 may be defined by depositing, annealing and patterning a layer of phosphosilicate glass (PSG) to form a mesa 184 (FIG. 8G1-2). The thickness of this layer may be 3 μm. PSG is silicon dioxide ($SiO_2$) with several mole percent phosphorus. PSG is chosen over pure $SiO_2$ because PSG is etched much more rapidly in hydrofluoric acid than $SiO_2$. Furthermore, PSG is softer, so thicker layers of it can be deposited without cracking. The PSG is annealed in dry nitrogen at 1000° C. to densify it. At the time the PSG is etched, the thermal oxide layer 177 grown on polysilicon pad 176 should be etched in the area of the etching channel to allow access of the silicon etchant to the polysilicon 176. The PSG 184 is not etched at the locations where holes (124 in FIG. 8L1) will be etched for electrical contacts to the tungsten filaments.

After the PSG patterning etch, any residual oxide on the exposed regions of nitride 178 should be carefully stripped, and a layer 186 of 1 μm of low-stress silicon nitride should be deposited (FIG. 8G1-2). This layer should represent approximately one half of the final thickness of the silicon nitride sealing membrane 36 (FIGS. 1A-C, 4A-B and 5A-C). Low stress LPCVD silicon nitride can be obtained using a pressure of 300 mT, a temperature of 835° C. and a ratio of about 4:1 between the flow rate of $SiCl_2H_2$ and the flow rate of $NH_3$. The nitride layer 186 should be patterned and etched above the etching channels 32 on the periphery of the device area, down to the polysilicon of etching channels 32 (FIG. 8H1-2). These openings in the nitride are the etching holes 34 leading to the etching channels 32 through which the sacrificial PSG and silicon substrate will be etched.

The etching channels 32 and the cavity in the silicon substrate should be anisotropically etched in an 80° C. potassium hydroxide (KOH) solution, which preferentially etches crystal faces {111} much more slowly than those in other directions. In contrast to isotropic etching, this step avoids undercutting the $Si_xN$ layer 178 and results in cavity walls 189 that angle inward as shown in FIG. 8I1-2. If the etch were continued long enough, a V-shaped groove would be formed, after which very little subsequent etching would occur in which case the etching would be self limited. In the present process, however, the etch can be stopped after 20 minutes when the cavity is about 20 μm deep.

The thermal silicon dioxide layer 177 and the PSG mesa 184 should then be etched using hydrofluoric acid. The protective polysilicon pad 182 should be etched with isotropic polysilicon etchant (FIG. 8J1-2).

The wafers or samples should be subsequently cleaned, and any residual oxide removed from the silicon nitride using HF. An additional layer 190 of silicon nitride (FIG. 8K1-2) should then be deposited, filling the etching holes and hermetically sealing the cavity containing the filaments. If the cavities are to be filled with a gas, the LPCVD deposition should be carried out in the presence of that gas. Alternatively, the deposition could be carried out by sputtering in the presence of the gas to be introduced into the cavity.

After the cavity is sealed, contact holes 124 for the electrodes should be opened and a metal layer deposited and patterned to obtain interconnections and outer electrodes 192 (FIG. 8L1-2). The contact holes are etched in two steps. First, the silicon nitride is etched with the PSG serving as an etch stop to prevent etching of the tungsten. Next, the PSG is etched.

As the last step, the vacuum in the cavity is improved by passing a current through filament 181, which heats the filament 181 so that residual gases are gettered by the titanium filament.

Device characteristics

Stoichiometric silicon nitride is transparent to radiation with wavelengths between 0.28 and 8 µm. The low-stress nitride window is not stoichiometric, having a composition of $Si_{1.0}N_{1.1}$ and a refractive index of 2.4. FIG. 9 shows the optical transmittance of a 1.3 µm thick low-stress silicon-nitride membrane measured using a FTIR spectrophotometer. The oscillatory nature of the transmittance is caused by interference in the thin membrane. The nitride is transparent between 0.5 and 8 µm; hence it transmits most of the radiation emitted by an incandescent filament.

The quality of the nitride seal was tested using a polysilicon filament microlamp, described in above-mentioned U.S. patent application Ser. No. 07/621,678, filed Dec. 3, 1990. First, the low bias I–V curves of a sealed microlamp were measured inside a vacuum system at both atmospheric pressure and 5 µT. Then the silicon-nitride window was punctured using a fine probe, and the measurements were repeated. FIG. 10 shows the I–V curves for both the sealed and the punctured devices. For the sealed microlamps (data points (a) and (b)), there is no dependence in the I–V curves on vacuum system pressure. For the punctured devices, however, the characteristics (data points (c) and (d)) are strongly dependent on vacuum-system pressure. The similarity in the dependence of data points (a), (b), and (d) indicates that the background pressure in the sealed devices is a good vacuum.

The temperature of the cathode as a function of voltage applied across it was measured with an optical pyrometer calibrated using the thermionic emission current. The constant-temperature hot part of the filament is about half of the filament length for filaments 200 µm long. FIG. 11 shows the measured cathode temperature plotted against the voltage.

FIG. 12 shows the anode current $I_A$ and grid current $I_G$ as a function of the voltage $V_A$ between anode and cathode, and the voltage $V_G$ between grid and cathode for an unsealed triode operated in a vacuum chamber.

Although demonstrated for the purpose of building a vacuum triode, the fabrication sequence described here can also be used to provide a microvacuum or gas-filled housing for other structures on a silicon substrate. Modifications of the disclosed vacuum tubes can also be made without departing from the scope of the invention. For example, grid electrodes could be provided outside the sealed cavity, an indirectly heated cathode could be used, a low-work function cathode surface could be provided, or the shape of the cathode could be modified to provide stress relief or field-assisted electron emission.

The present invention has been described in terms of several preferred embodiments. The invention, however, is not to be limited to the embodiments depicted and described. Rather, the scope of the invention is defined by the appended claims.

What is claimed is:

1. A method for forming a microstructure, said method comprising the steps of:

providing a substrate including a first etchable structure, wherein said first etchable structure is at least partly exposed;

forming a patterned planar unetchable structure having at least one layer on said substrate, at least a portion of which is above an exposed portion of said first etchable structure;

forming a patterned second etchable structure on top of said unetchable structure, wherein a portion of said unetchable structure, but not the entire said unetchable structure, is between parts of the first and second etchable structures;

depositing an unetchable membrane layer on top of said patterned second etchable structure;

opening etching holes in said membrane layer in an area thereof where it overlaps one of said first and second etchable structures;

etching said first and second etchable structures to a predetermined extent to form a cavity with a suspended member, the cavity including at least one etching channel bound by said membrane layer;

creating a predetermined ambient in said cavity; and depositing additional material to fill said etching channel and seal the cavity.

2. A method for forming a microstructure, said method comprising the steps of:

providing a substrate including a first etchable structure, wherein said first etchable structure is at least partly exposed;

forming a patterned planar unetchable structure having at least one layer on said substrate, at least a portion of which is above an exposed portion of said first etchable structure;

forming a patterned second etchable structure on top of said unetchable structure, wherein a portion of said unetchable structure, but not the entire said unetchable structure, is between parts of the first and second etchable structures;

depositing an unetchable membrane layer on top of said patterned second etchable structure;

opening etching holes in said membrane layer in an area thereof where it overlaps one of said first and second etchable structures;

etching said first and second etchable structures to a predetermined extent to form a cavity with a suspended member, the cavity including at least one etching channel not bound by said unetchable structure;

creating a predetermined ambient in said cavity; and depositing additional material to fill said etching channel and seal the cavity.

3. A method for forming a microstructure, said method comprising the steps of:

providing a substrate including a first etchable structure, wherein said first etchable structure is at least partly exposed;

forming a patterned planar unetchable structure having at least one layer on said substrate, at least a portion of which is above an exposed portion of said first etchable structure;

forming a patterned second etchable structure on top of said unetchable structure, wherein a portion of said unetchable structure, but not the entire said unetchable structure, is between parts of the first and second etchable structures;

depositing an unetchable membrane layer on top of said patterned second etchable structure;

opening etching holes in said membrane layer in an area thereof where it overlaps one of said first and second etchable structures;

etching said first and second etchable structures to a predetermined extent to form a cavity with a suspended member;

creating a predetermined ambient in said cavity; and depositing additional material to seal the cavity.

4. The method of claim 3 wherein the etching step is self limited.

5. The method of claim 3, 1 or 2, further comprising:

after sealing the cavity, changing the ambient within the cavity.

6. The method of claim 5 wherein the ambient is changed by heating the suspended member.

* * * * *

UNITED STATES PATENT AND TRADEMARK OFFICE
CERTIFICATE OF CORRECTION

PATENT NO.   : 5,493,177

DATED        : February 20, 1996

INVENTOR(S)  : Muller et al.

It is certified that an error appears in the above-identified patent and that said Letters Patent is hereby corrected as shown below:

In column 1, line 29, change "108" to --$10^8$--.

Signed and Sealed this

Eleventh Day of March, 1997

Attest:

BRUCE LEHMAN

Attesting Officer

Commissioner of Patents and Trademarks